(12) United States Patent
Ito et al.

(10) Patent No.: US 6,396,142 B1
(45) Date of Patent: May 28, 2002

(54) SEMICONDUCTOR DEVICE

(75) Inventors: Fujio Ito, Hanno; Hiroaki Tanaka, Kodaira; Hiromichi Suzuki, Tachikawa; Tokuji Toida, Hamura; Takafumi Konno, Hakodate; Kunihiro Tsubosaki, Hino; Shigeki Tanaka, Hakodate; Kazunari Suzuki, Tokyo; Akihiko Kameoka, Ogose-machi, all of (JP)

(73) Assignees: Hitachi, Ltd.; Hitachi ULSI Systems Co., Ltd., both of Tokyo; Hitachi Hokkai Semiconductor, Ltd., Hokkaido, all of (JP)

( * ) Notice: Subject to any disclaimer, the term of this patent is extended or adjusted under 35 U.S.C. 154(b) by 0 days.

(21) Appl. No.: 09/369,402

(22) Filed: Aug. 6, 1999

(30) Foreign Application Priority Data

Aug. 7, 1998 (JP) .......................................... 10-224392

(51) Int. Cl.⁷ .............................................. H01L 23/48
(52) U.S. Cl. ........................ 257/712; 257/706; 257/667
(58) Field of Search ................................ 257/667, 676, 257/786, 692, 695, 712, 706

(56) References Cited

U.S. PATENT DOCUMENTS

| 4,797,726 A | * | 1/1989 | Manabe ........................ 357/70 |
| 5,150,193 A | * | 9/1992 | Yasuhara et al. .............. 357/70 |
| 5,233,222 A | * | 8/1993 | Djennas et al. .............. 257/676 |
| 5,378,656 A | * | 1/1995 | Kajihara et al. ............. 437/217 |
| 5,381,042 A |   | 1/1995 | Lerner et al. |
| 5,397,915 A | * | 3/1995 | Nose .......................... 257/676 |
| 5,661,338 A | * | 8/1997 | Yoo et al. .................... 257/676 |
| 5,708,294 A | * | 1/1998 | Toriyama ..................... 257/676 |
| 5,712,507 A | * | 1/1998 | Eguchi et al. ............... 257/666 |
| 5,874,773 A | * | 2/1999 | Terada et al. ................ 257/676 |

FOREIGN PATENT DOCUMENTS

JP         8-204100         8/1996

OTHER PUBLICATIONS

"VLSI Packaging Techniques (vol. 1)", published by Nikkei BP (in Japan), May 31, 1993, pp. 155–164.
"VLSI Packaging Techniques (vol. 2)", Nikkei BP, May 31, 1993, pp. 200–203.

* cited by examiner

Primary Examiner—Eddie Lee
Assistant Examiner—Lourdes Cruz
(74) Attorney, Agent, or Firm—Antonelli, Terry, Stout & Kraus, LLP

(57) ABSTRACT

In a semiconductor device having a heat radiation plate, the tips of inner leads connected to a semiconductor chip have a lead width w and a lead thickness t, the width being less than the thickness. The inner leads are secured to the heat radiation plate. Fastening the inner leads to the heat radiation plate supports the latter and eliminates the need for suspending leads. A lead pitch p, the lead width w and lead thickness t of the inner lead tips connected to the semiconductor chip have the relations of w<t and p≦1.2t, with the inner leads secured to the heat radiation plate. The heat radiation plate has slits made therein to form radially shaped heat propagation paths between a semiconductor chip mounting area and the inner leads. In a molding member-sealed semiconductor device wherein the semiconductor chip is fixed to the heat radiation plate, the tip thickness t' of the inner leads is made less than the thickness t of the other portions of the inner leads secured to the heat radiation plate.

23 Claims, 16 Drawing Sheets

SEMICONDUCTOR DEVICE

BACKGROUND OF THE INVENTION

The present invention relates to a semiconductor device incorporating a lead frame. More particularly, the invention relates to techniques adapted advantageously to a semiconductor device with a lead frame comprising numerous leads as well as heat radiation plates.

LSIs and other semiconductor devices have undergone ever-higher levels of circuit integration while incorporating higher functions and more complicated circuits than ever before. The enhanced functionality requires furnishing each semiconductor device with a large number of external terminals. This in turns involves increasing the number of pad electrodes provided on a semiconductor chip as well as the number of leads, i.e., external terminals of the semiconductor device. A typical logic semiconductor device may have hundreds of external terminals. Semiconductor devices of the so-called QFP (quad flat package) type, well known as a family of semiconductor devices each having numerous external terminals, are generally mounted on one side of a substrate and are called surface-mounted semiconductor devices. The QFP type semiconductor device is suitable for accommodating a large number of leads because each of the four sides of the package enclosing the semiconductor chip can carry a plurality of leads. When mounted on a substrate, this type of semiconductor device permits an effective use of the space around it.

A lead frame used in the assembling of such QFP type semiconductors is discussed illustratively in "VLSI Packaging Techniques (Vol. 1)" published by Nikkei BP (in Japan) on May 31, 1993, pp. 155–164. In particular, specific patterns of the frame are shown on pp. 157 and 159 of this publication.

Fine structure of the semiconductor chip comprise an increasing number of elements each operating at a higher speed than ever. This causes an increase of heat generation from the semiconductor chip. The problem is avoided illustratively by a semiconductor device having a heat spreader, as described in the "VLSI Packaging Techniques" (Vol. 1), pp. 200–203. The semiconductor device has its semiconductor chip furnished with a heat spreader arrangement to promote heat dissipation of the device.

SUMMARY OF THE INVENTION

In accommodating a large number of leads, the lead frame needs to have its lead-to-lead spacing (i.e., lead pitch) narrowed and the width of its leads lessened.

The semiconductor chip also comprises numerous pad electrodes whose presence is necessitated by the enhanced functionality of the semiconductor device. Meanwhile, the spacing between pad electrodes (i.e.,pad pitch) has been reduced over the years. Whereas there are different pad pitches for different semiconductor chips in general, the need to obtain as many chips as possible per wafer involves establishing the smallest possible chip size. The trend in turn requires having the smallest possible pitch between pad electrodes.

Given such reduced pad pitches and under restrictions associated therewith, the process of bonding the many leads to the corresponding pad electrodes using wires made of gold or like material tends to trigger an increasing number of short-circuits between adjacent wires.

During resin molding after the wire bonding, a decline in the mechanical strengths of leads or a narrowed wire spacing may allow wires to become deformed by molding resin fluidity. The deformation called wire flow can result in short-circuited wires.

Furthermore, in a QFP, the area in which it is desired to lay out leads becomes narrower the closer it gets to a centrally located semiconductor chip. The thickness and the pitch of the leads are subject to limitations stemming from the limitation of the manufacturing precision of the lead. More specifically, the lead pitch cannot be made sufficiently fine compared with the pad patch on the semiconductor chip. As the semiconductor chip shrinks in external dimensions, it becomes increasingly difficult to bring the tips of the leads close to the chip. When the lead tips to be bonded are distanced from the pad electrodes of the semiconductor chip under such circumstances, wires for bonding the pads to the leads must be extended. Extended wires are likely to cause more short-circuits or result in more wire flow than before.

While today's practical pad pitches are down to about 80 $\mu$m, the required pitch is expected to reach 60 to 45 $\mu$m in the future. As chips shrink further, bonding wires are extended correspondingly. At present, it is necessary to keep the wire length to a maximum of 5 or 6 mm in order to ensure stable bonding. This a further the pitch of reduction in lead tips so as to avert wire extensions.

FIG. 1 shows results of simulations performed by the inventors relating to wire bonding. On 256-pin semiconductor chips with different pad pitches, correlations were simulated between inner lead tip pitches on the one hand and wire lengths for stable bonding on the other hand. The simulations revealed the need to restrict the lead tip pitch to a maximum of 180 $\mu$m with respect to the 60 $\mu$m pad pitch in order to ensure stable bonding.

Such micro-fabrication of the leads is bound to lower their mechanical strength. Even an extremely limited amount of force can thus deform the tenuous lead formation. The deformed leads trigger short-circuits.

A conventional solution to the above problem is the fastening of inner leads using an insulating tape to prevent lead deformation. FIG. 2 is a plan view of a conventionally structured tape-fastened lead frame. FIG. 3 is a cross-sectional view of a resin-sealed semiconductor device fabricated by use of the lead frame in FIG. 2.

The lead frame is illustratively made of a copper alloy. A semiconductor chip 1 (indicated by broken lines) is fixed to a tab 2. A plurality of leads 3 are located around the entire periphery of the mounted semiconductor chip 1. The leads 3 come in two types: inner leads 4 and outer leads 5. The tips of the inner leads 4 surround the semiconductor chip 1.

The leads 3 are integrated with a dam bar 6 or with a tie bar 8 constituting a framework of the lead frame. The inner and outer leads 4 and 5 are formed inside and outside of the dam bar 6, respectively. The tab 2 is supported by tab suspending leads 7 furnished across the inner leads 4. The inner leads 4 and the tab suspending leads 7 are fastened to a rectangular insulating tape 9.

In the case of a semiconductor device using the above-described lead frame, the semiconductor chip 1 is fixed to the tab 2 by resin or by silver paste while the inner leads 4 are connected to pad electrodes 10 of the chip 1 by bonding wires 11. After bonding, these semiconductor chip 1, tab 3, inner leads 4 and bonding wires 11 are molded by a molding member 12 illustratively made of epoxy resin. The dam bar 6 and tie bar 8 are cut so that the leads 3 are electrically isolated from one another. Thereafter, the outer leads 5 extending from the molding member 12 are illustratively formed in gull wing fashion as shown in FIG. 3. This completes fabrication of the semiconductor device.

With the tape-fastened lead frame, as shown in FIGS. 2 and 3, a middle part of the inner leads 4 is secured by the tape 9 to allow for flexible uses of the frame. In other words, the tape 9 is positioned away from the tips of the inner leads 4. This is an in efficient and unstable structure for fastening the inner lead tips to which wires are to be bonded.

Furthermore, some recently developed semiconductor devices have been subject to significant heat generation from semiconductor chips because of their enhanced functionality and high performance. These devices have their semiconductor chips equipped with a heat radiation plate such as a heat spreader to facilitate heat dissipation.

FIG. 4 is a plan view of a lead frame for use with a heat spreader-incorporating QFP (called HQFP hereunder), wherein a copper foil devised by the inventors is attached by adhesive to a semiconductor chip as a heat radiation plate. This setup has not been disclosed until now. FIG. 5 is a cross-sectional view of a semiconductor device fabricated by use of the lead frame in FIG. 4.

As opposed to the lead frame and semiconductor device discussed earlier, this semiconductor chip 1 (indicated by broken lines) is fastened to a heat radiation plate 13. The inner leads 4 are also fixed to the heat radiation plate 13.

Such HQFP type semiconductor devices comprise numerous contacts between the molding member 12 and the heat radiation plate 13. Because of a feeble adhesive strength between resin (i.e., molding member 12) and metal (heat radiation plate 13), moisture absorbed in the interface between the molding member 12 and the heat radiation plate 13 can evaporate and expand during reflow heating, causing a crack in the package. The reflow heating occurs during the process of mounting a surface-mounted semiconductor device onto a substrate. The semiconductor device of FIG. 4 addresses the reflow problem by having a round hole provided in the middle of the heat radiation plate 13, the hole allowing the molding member 12 to contact the semiconductor chip 1. However, this structure is still not sufficient to overcome the problem.

It is therefore an object of the present invention to provide techniques for stabilizing the bonding of a semiconductor device having numerous leads.

It is another object of the present invention to provide techniques for preventing generation of a crack in the package of a semiconductor device furnished with a heat radiation plate.

A summary of typical aspects of the invention disclosed in the present application will be described in brief in the following manner.

In a semiconductor device having a semiconductor chip fixed to a radiation plate and sealed by a sealant, the semiconductor chip is connected to tips of inner leads having a lead width of w and a lead thickness of t, wherein the lead width w is less than the lead thickness t (w<t), and wherein at least the tips of the inner leads are fastened to the radiation plate.

In a semiconductor device having a semiconductor chip fixed to a radiation plate and sealed by a sealant, the semiconductor chip is connected to tips of inner leads having a lead width of w and a lead thickness of t, wherein the lead width w is less than the lead thickness t and wherein at least the tips of the inner leads are fastened to the radiation plate so as to support the radiation plate. This structure eliminates the need for installing conventional suspending leads supporting the radiation plate.

In a semiconductor device having a semiconductor chip fixed to a radiation plate and sealed by a sealant, the semiconductor chip being connected to tips of inner leads having a lead pitch of p, a lead width of w and a lead thickness of t, wherein the lead width w is less than the lead thickness (w<t), wherein the lead pitch p is equal to or less than 1.2 times the lead thickness t ($p \leq 1.2t$), and wherein at least the tips of the inner leads are fastened to the radiation plate.

In a semiconductor device having a semiconductor chip fixed to a radiation plate and sealed by a sealant, the radiation plate has slits formed therein in a radial fashion to establish heat propagation paths radiating from a semiconductor chip mounting area on the plate toward inner leads.

In a semiconductor device having a semiconductor chip fixed to a radiation plate and sealed by a sealant, the tips of inner leads (tip thickness t') are made thinner than the other portions of the inner leads (lead thickness t), and at least the tips of the inner leads are fastened to the radiation plate.

In a method of fabricating a semiconductor device having a semiconductor chip fixed to a radiation plate and sealed by a sealant, the method comprises the steps of: connecting the semiconductor chip to tips of inner leads having a lead pitch of p, a lead width of w and a lead thickness of t, wherein the lead width w is less than the lead thickness t (w<t) and wherein the lead pitch p is equal to or less than 1.2 times the lead thickness t ($p \leq 1.2t$); fastening at least the tips of the inner leads to the radiation plate; and connecting the inner leads to pad electrodes of the semiconductor chip.

In a method of fabricating a semiconductor device having a semiconductor chip fixed to a radiation plate and sealed by a sealant, the method to form the steps of: making slits in the radiation plate in a radial fashion forming heat propagation paths radiating from a semiconductor chip mounting area on the plate toward inner leads; and applying a sealant by letting it penetrate through the slits in the radiation plate during resin sealing.

In a method of fabricating a semiconductor device having a semiconductor chip fixed to a radiation plate and sealed by a sealant, the method comprises the steps of: fastening the semiconductor chip to the radiation plate on a lead frame wherein tips of inner leads (tip thickness t') are made thinner than the other portions of the inner leads (lead thickness t); and connecting the inner leads to pad electrodes of the semiconductor chip wherein at least the tips of the inner leads are fastened to the radiation plate.

In a lead frame comprising a plurality of leads and a radiation plate having a semiconductor chip mounting area onto which to fix a semiconductor chip, the semiconductor chip is connected to tips of inner leads among the leads, the inner lead tips having a lead pitch of p, a lead width of w and a lead thickness of t, wherein the lead width w is less than the lead thickness t (w<t), wherein the lead pitch p is equal to or less than 1.2 times the lead thickness t ($p \leq 1.2t$), and wherein at least the tips of the inner leads are fastened to the radiation plate.

In a lead frame comprising a plurality of leads and a radiation plate having a semiconductor chip mounting area onto which to fix a semiconductor chip, the radiation plate having slits formed therein in a radial fashion to establish heat propagation paths radiating from the semiconductor chip mounting area on the plate toward inner leads.

In a lead frame comprising a plurality of leads and a radiation plate having a semiconductor chip mounting area onto which to fix a semiconductor chip, the tips of inner leads among the leads (tip thickness t') are made thinner than the other portions of the inner leads (lead thickness t), and at least the tips of the inner leads are fastened to the radiation plate.

According to the present invention, there is provided a semiconductor device comprising: a heat radiation plate including a main surface and a back surface opposite to the main surface, the heat radiation plate having through type slits penetrating from the main surface to the back surface; a semiconductor chip having a semiconductor element and a plurality of electrodes furnished on a principal plane, the semiconductor chip being fastened to the main surface of the heat radiation plate; a plurality of leads made of an inner lead and an outer lead each, tips of the inner leads being fixed to the heat radiation plate, the inner leads being connected electrically to electrodes of the semiconductor chip; and a molding member sealing the heat radiation plate, the semiconductor chip, and the inner leads; wherein the through type slits are laid out in a radial fashion radiating from outside a semiconductor chip mounting area of the heat radiation plate toward a region surrounded by the tips of the inner leads.

In the above semiconductor device, the heat radiation plate may be rectangular in shape and the through type slits may be fabricated to extend toward four corners of the heat radiation plate.

Further, according to the present invention, there is provided a semiconductor device comprising: a heat radiation plate including a main surface and a back surface opposite to the main surface, the heat radiation plate having through type slits penetrating from the main surface to the back surface; a semiconductor chip having a semiconductor element and a plurality of electrodes furnished on a principal plane, the semiconductor chip being fastened to the main surface of the heat radiation plate; a plurality of leads made of an inner lead and an outer lead each, tips of the inner leads being fixed to the heat radiation plate, the inner leads being connected electrically to electrodes of the semiconductor chip; and a molding member sealing the heat radiation plate, the semiconductor chip, and the inner leads; wherein the through type slits are laid out in a radial fashion radiating toward a region surrounded by the inner leads on the heat radiation plate.

In the above semiconductor device, the through type slits may be fabricated so that the back surface of the semiconductor chip is partially exposed.

In the above semiconductor device, the heat radiation plate may be rectangular in shape and the through type slits may be fabricated to extend toward four corners of the heat radiation plate.

As outlined above and according to the invention, the tips of the inner leads are fastened to the heat radiation plate. The structure eliminates the need for installing tab suspending leads supporting tabs that carry the semiconductor chip. The area that was conventionally allocated to the tab suspending leads is utilized for accommodating the inner leads. Given the same lead pitch, the structure allows the inner lead tips to be located closer to the semiconductor chip than before.

The inventive structure in which the inner lead tips are fastened to the heat radiation plate stabilizes bonding and prevents deformation of the inner leads.

According to the invention, the heat radiation plate has slits formed therein in a radial direction to establish heat propagation paths. The structure enhances protection against the reflow problem while minimizing a decline in the heat radiation characteristic.

Also according to the invention, the inner lead tips are made thinner than before so as to improve the accuracy in fabricating the tips. Fixing the inner lead tips to the heat radiation plate reinforces resistance to the deformation of the tips.

These and other objects, features and advantages of the invention will become more apparent upon a reading of the following description and appended drawings.

BRIEF DESCRIPTION OF THE DRAWINGS

FIG. 11(a) is a plan view and a

FIG. 14(b) is a cross-sectional view indicating how inner lead tips or pad electrodes of a semiconductor chip are laid out;

DESCRIPTION OF THE PREFERRED EMBODIMENTS

Figure 1:
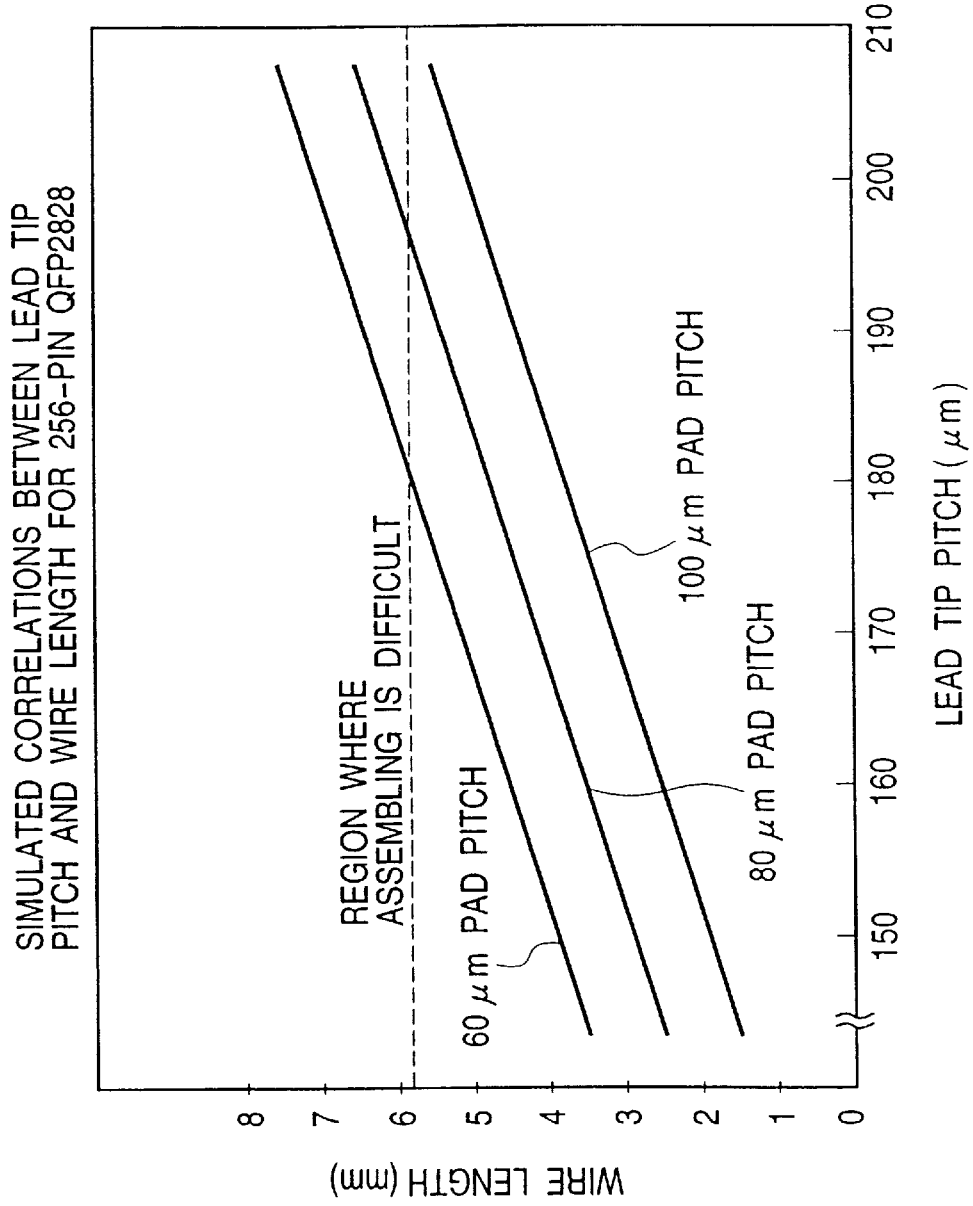
FIG. 1 is a graphic representation showing results of simulations about wire bonding.

Preferred embodiments of this invention will now be described with reference to the accompanying drawings.

Throughout the drawings, like reference characters designate like or corresponding parts, and their descriptions are omitted where they are repetitive.

First Embodiment

Figure 6:
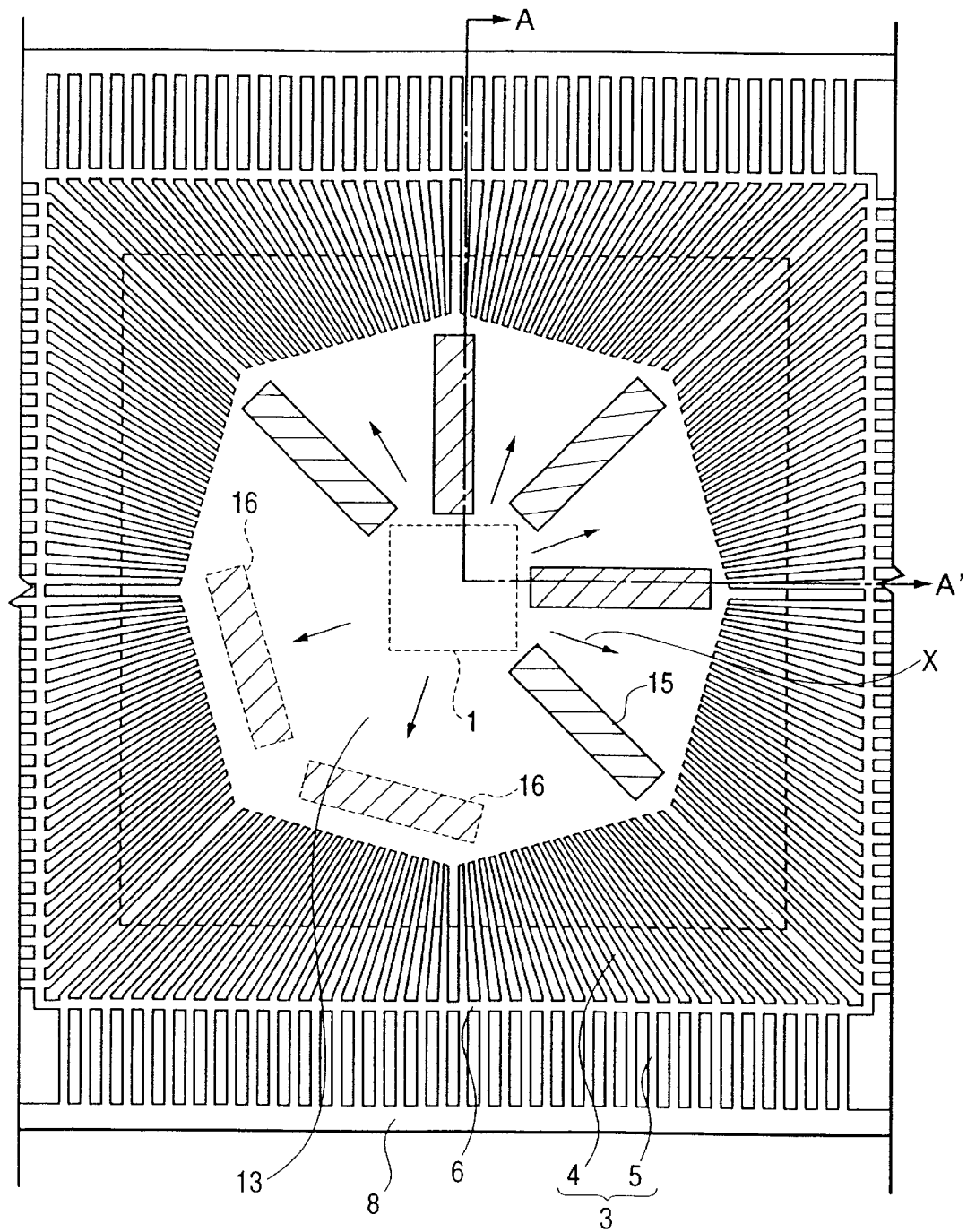
FIG. 6 is a plan view of a lead frame representing an embodiment of the invention.
Figure 7:
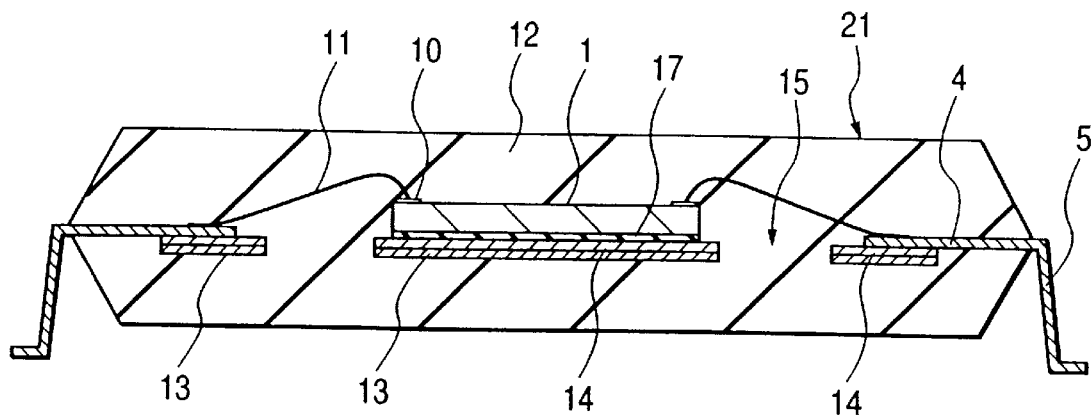
FIG. 7 is a cross-sectional view of a resin-sealed semiconductor device fabricated by use of the lead frame in FIG. 6, the view being taken on line A–A' in FIG. 6.
Figure 8A:
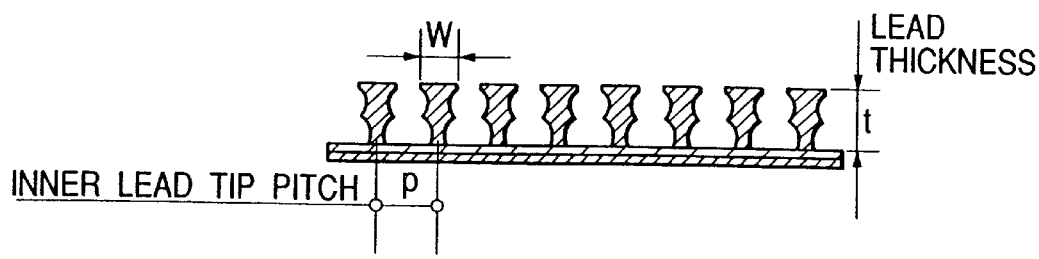
FIGS. 8(a) and 8(b) are cross-sectional views of tips of inner leads on the lead frame in FIG. 6.
Figure 8B:
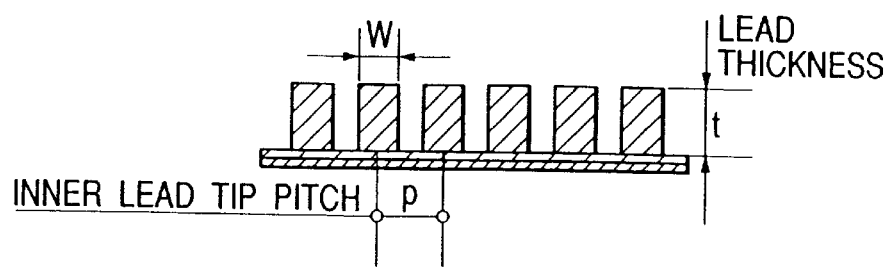

FIG. 6 is a plan view of a lead frame for an HQFP type semiconductor device practiced as a first embodiment of the invention. FIG. 7 is a cross-sectional view of a semiconductor device fabricated by use of the lead frame in FIG. 6, the view being taken on line A–A' in FIG. 6. FIGS. 8(a) and 8(b) are cross-sectional views of tips of inner leads on the lead frame in FIG. 6. FIG. 8(a) shows lead tips formed by etching, while FIG. 8(b) shows lead tips formed by press work.

The lead frame is made illustratively of an Fe-Ni alloy or a copper alloy. The entire periphery of a semiconductor chip 1 (indicated by broken lines) is surrounded by tips of inner leads 4 among a plurality of leads 3. The leads 3 are integrated with a dam bar 6 or with a tie bar 8 constituting a framework of the lead frame. An inside and an outside portion of the dam bar 6 make up the inner leads 4 and outer leads 5, respectively. The semiconductor chip 1 is bonded fixedly to a heat radiation plate 13 using a polyimide type adhesive 14 and a die bonding agent 17. The inner leads 4 are fastened to the heat radiation plate 13 by use of the adhesive 14.

In the case of a semiconductor device using the above-described lead frame, the semiconductor chip 1 is fixed to the heat radiation plate 13 by resin or by silver paste 17 while the inner leads 4 are connected to pad electrodes 10 of the chip 1 by bonding wires 11. After the bonding, the semiconductor chip 1, heat radiation plate 13, inner leads 4 and bonding wires 11 are sealed by a molding member 12 illustratively made of epoxy resin. The dam bar 6 and tie bar 8 are cut so that the leads 3 are electrically isolated from one another. Thereafter, the outer leads 5 extending from the molding member 12 are illustratively formed in a gull wing shape or in another appropriate manner. This completes fabrication of the semiconductor device 21.

On an etched lead frame, the lead top width is made greater than the lead bottom width so that the lead tops will be wide enough to accommodate bonding while the lead width w is minimized. To produce such a cross-sectional structure illustratively requires altering the etching conditions on the tops and bottoms of the leads.

At the lead tips where the lead pitch p is narrow, the lead thickness t is less than the lead width w. This lead structure tends to suffer from poorly fastened wires at the time of bonding and is vulnerable to crosswise deformation. It follows that on a lead frame where the pitch of the inner lead tips is 180 μm, i.e., 1.2 times the lead thickness or less, the inner leads 4 are preferably fixed to the heat radiation plate 13.

Figure 2:
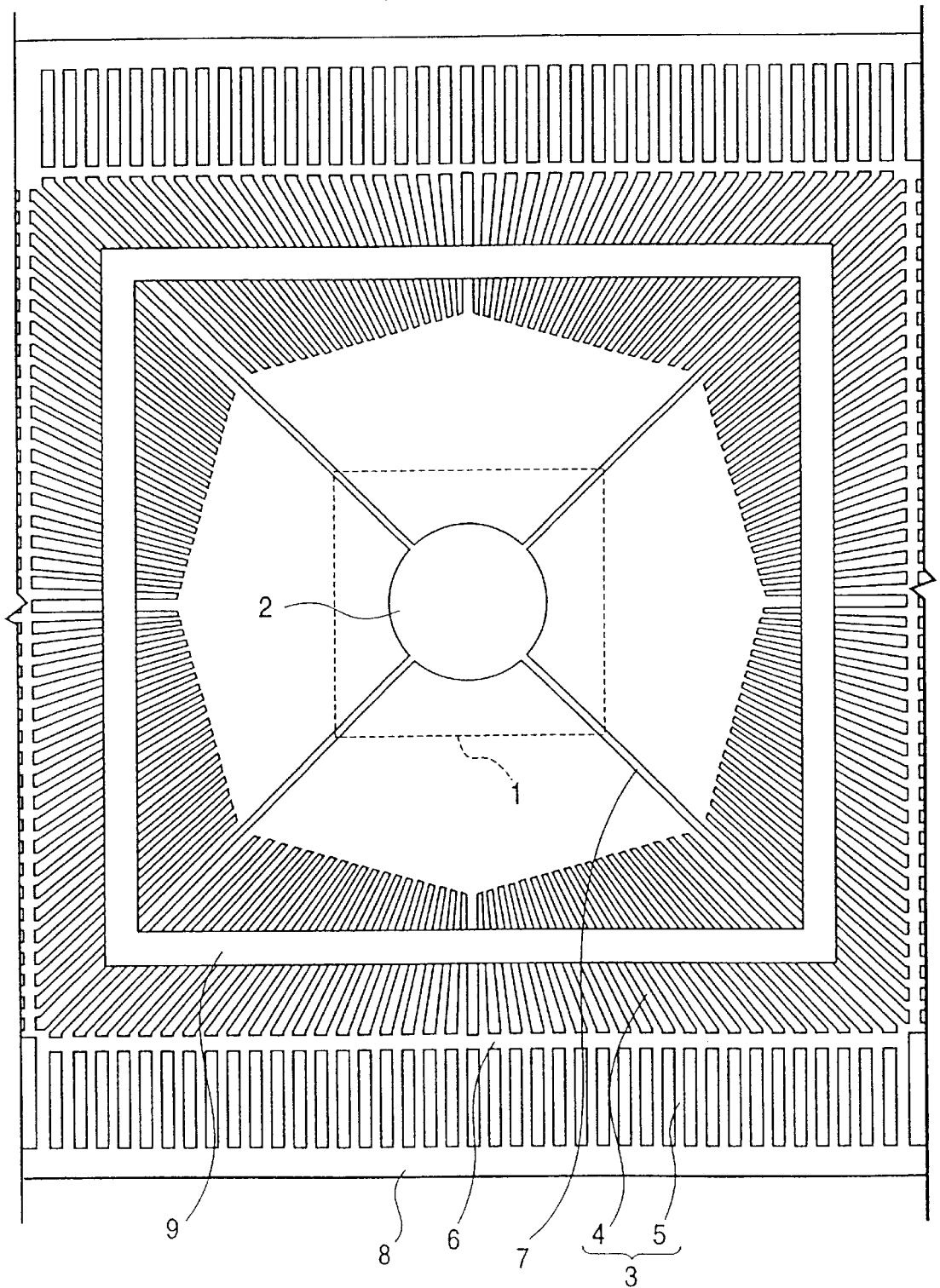
FIG. 2 is a plan view of a conventionally structured tape-fastened lead frame.
Figure 3:
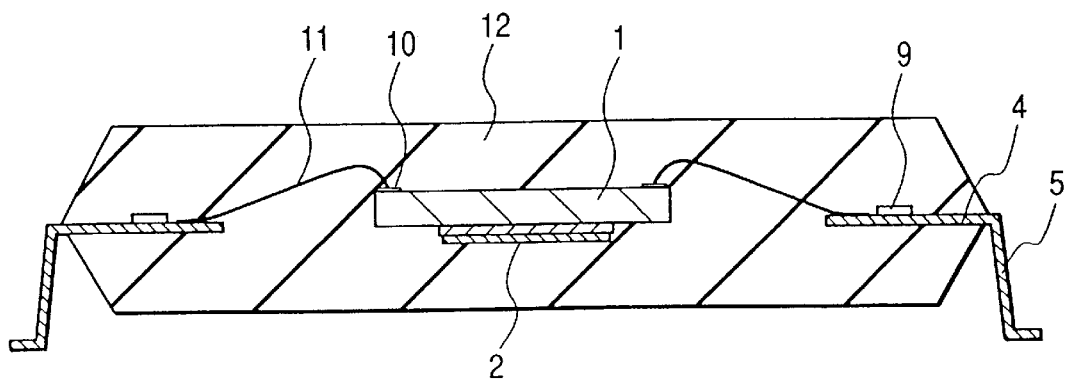
FIG. 3 is a cross-sectional view of a resin-sealed semiconductor device fabricated by use of the lead frame in FIG. 2.
Figure 5:
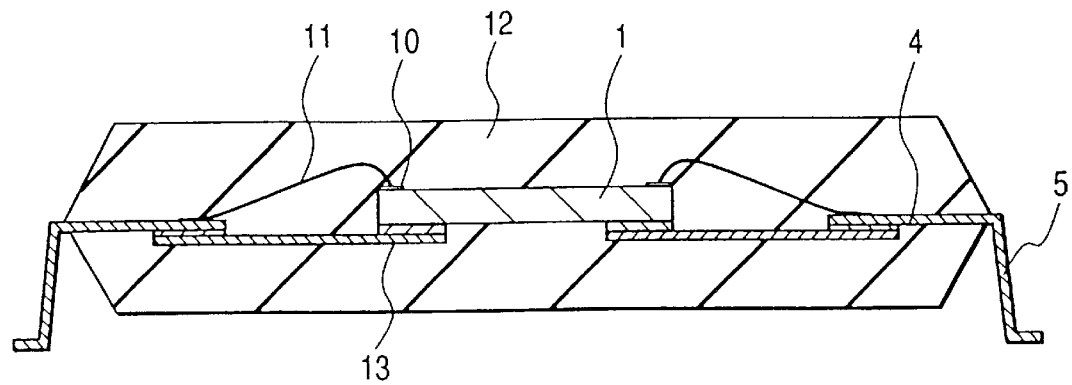
FIG. 5 is a cross-sectional view of a resin-sealed semiconductor device fabricated by use of the lead frame in FIG. 4.
Figure 4:
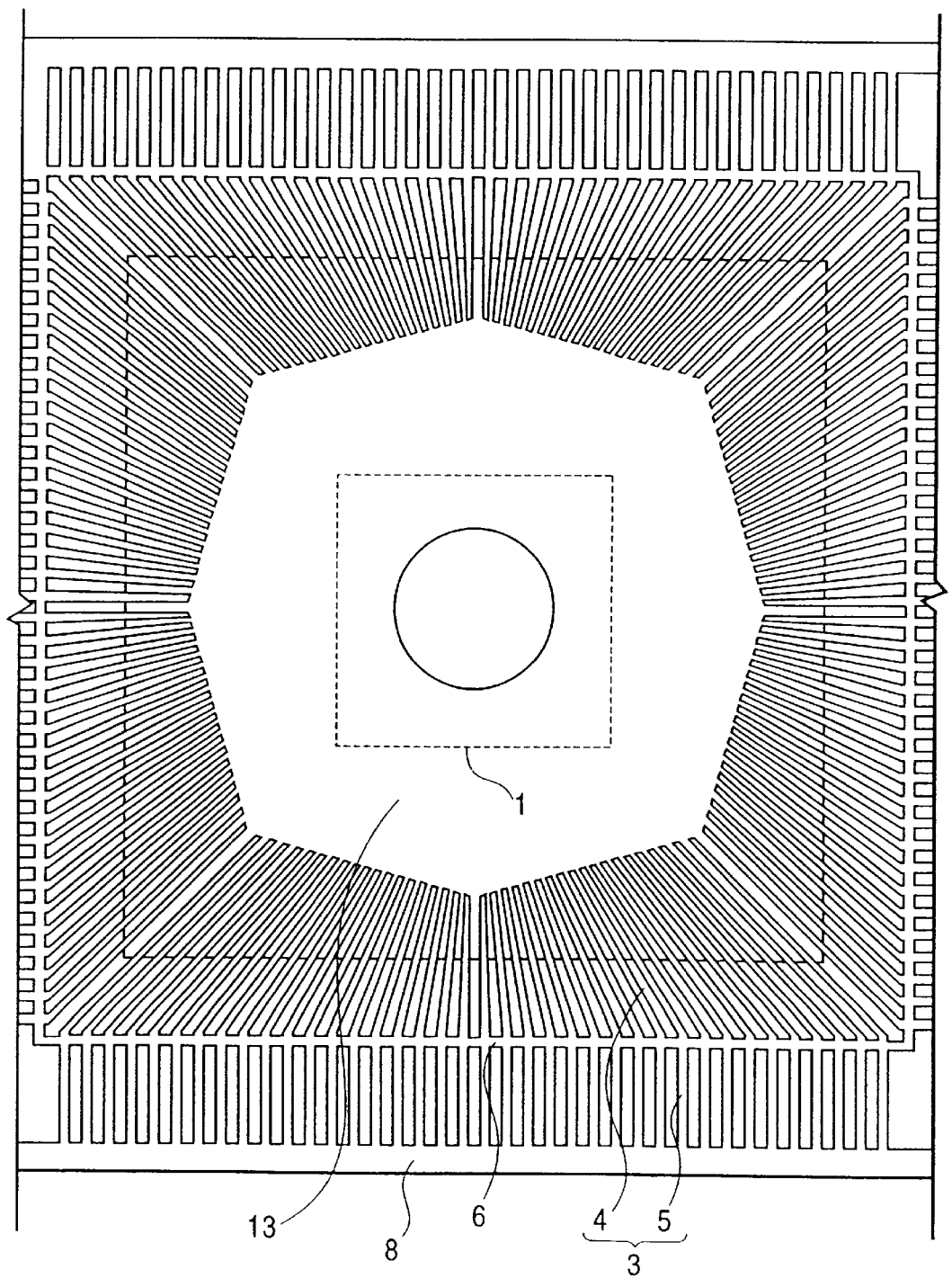
FIG. 4 is a plan view of a lead frame for HQFP use devised by the inventors.
Figure 9A:
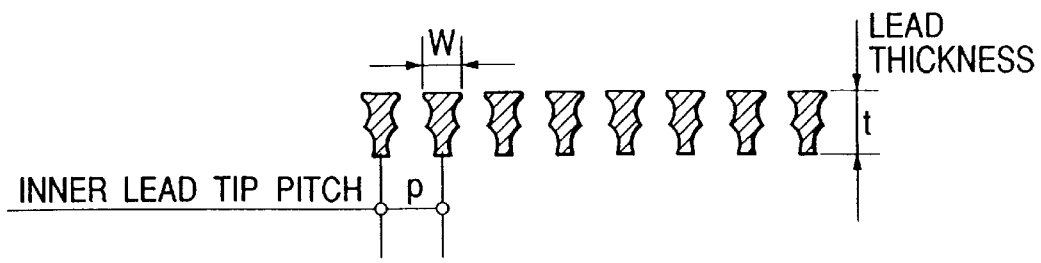
FIGS. 9(a) and 9(b) are cross-sectional views of tips of inner leads on the lead frame in FIG. 2.
Figure 9B:
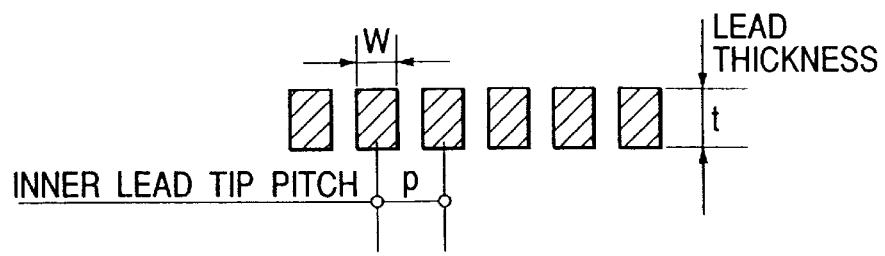

With the inner leads 4 fixed to the heat radiation plate 13, the lead tips are kept anchored during wire bonding. This ensures reliability of wire bonding. The benefit is corroborated by comparison with cross-sectional views of FIGS. 9(a) and 9(b) showing inner leads 4 of the lead frame in FIG. 2.

Today, lead frames are approximately 150 μm in thickness, about as thin as they can get in the face of possible deformation of the outer leads 5. The lead pitch is typically 185 μm, the lead width is 100 μm, and the lead spacing is 85 μm. In the future, on lead frames with a narrow lead pitch, the lead pitch at the tips of the inner leads 4 will be 180 μm or less. Likewise the lead width w is expected to be less than the lead thickness (w<t) and the inner lead tip pitch p is expected to be equal to or less than 1.2 times the lead thickness t (p≦1.2t). In such cases, according to the invention, the inner leads 4 are to be fixed to the heat radiation plate 13 on the lead frame to keep the lead tips anchored during wire bonding. The structure should enhance the reliability of wire bonding.

On the lead frame of the invention, the semiconductor chip 1 is fastened to a semiconductor chip mounting area on the heat radiation plate 13 fixed by the inner leads 4. In this setup, there are no tab suspending leads furnished conventionally to support tabs on which to mount a semiconductor chip. Regions where the tab suspending leads used to be provided are utilized for the layout of inner leads 4.

In the setup above, the corners where tab suspending leads were conventionally furnished also accommodate inner leads 4. Given the same lead pitch, it is thus possible to locate the tips of the inner leads 4 closer to the semiconductor chip 1 than before. This in turn shortens the lengths of wires to be bonded after the semiconductor chip 1 is mounted. As a result, wire deformation is minimized and short-circuits between wires are reduced during sealing by use of resin.

It is also possible to widen the lead pitch or increase the number of leads without getting the tips of inner leads 4 coming closer to one another.

Slits 15 are made in the heat radiation plate 13 between the area on which to mount the semiconductor chip 1 on the one hand and the inner leads 4 on the other hand. The slits 15 allow the molding member 12 to penetrate through the heat radiation plate 13 and make it difficult for the plate 13 and the molding member 12 to separate. With the molding member 12 penetrating the heat radiation plate 13, an enhanced level of resistance to the reflow problem is attributable to two causes: an increased force of the molding member holding down the semiconductor chip 1, and a separated interface between the heat radiation plate 13 and the molding member 12 also disconnecting forces caused by evaporation and expansion of the moisture content. The semiconductor chip 1 to be mounted varies in size depending on what function is specifically required of it. In this embodiment, the semiconductor chips 1 and the slits 15 are unchanged in their sizes. When a larger semiconductor chip is to be mounted the, edges of the chip are partially overlaid with the slits 15, and the chip is secured by the resin 12.

Figure 10:
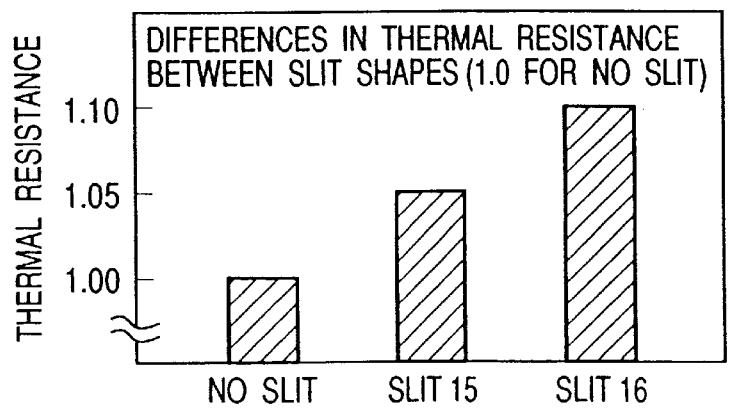
FIG. 10 is a graphic representation comparing different types of slits in terms of thermal resistance.

The slits 15 are shaped so that heat propagation paths X of the heat radiation plates 13 are formed in a radial direction, as indicated by arrows X. Illustratively putative conventional slits 16, indicated by broken lines, arranged perpendicular to the heat propagation paths x, shown here for reference, will interrupt propagation of heat along the paths x. FIG. 10 is a graphic representation comparing different types of slits in terms of therm resistivity. In FIG. 10, the inventive slit setup represented by slit 15 and the conventional slit setup denoted by slit 16 are compared with a setup with no slit. It can be seen that the inventive slit setup 15 maintains the rise in thermal resistivity at a lower level than the other setups and minimizes the possibility of deterioration caused by heat dissipation.

With the HQFP type semiconductor device described above, the tips of the inner leads 4 or the pad electrodes 10 of the semiconductor chip 1 may be laid out in an alternate arrangement (staggered fashion). The staggered layout provides further reliability in bonding wires.

Figure 11B:
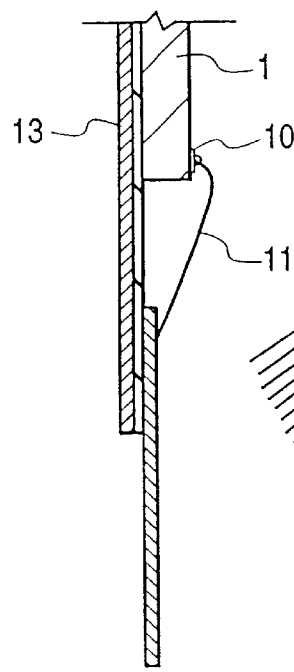
FIG. 11(b) is a cross-sectional view showing how inner lead tips or pad electrodes of a semiconductor chip are laid out.
Figure 11A:
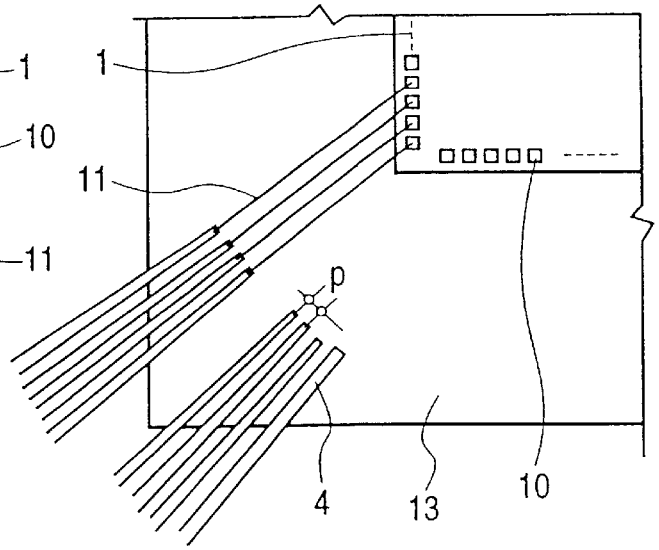
Figure 12B:
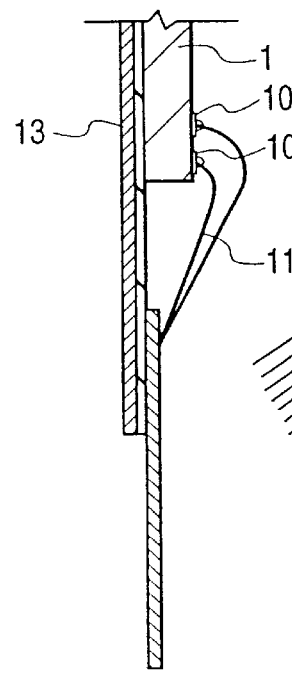
FIG. 12(b) is a cross-sectional view depicting how inner lead tips or pad electrodes of a semiconductor chip are laid out.
Figure 12A:
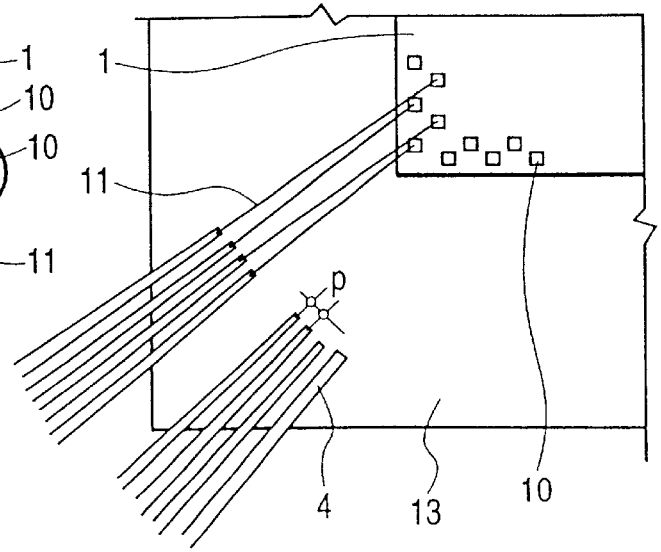
FIG. 12(a) is a plan view.

Conventionally, as shown in FIG. 11(a) and FIG. 11(b), the tips of the inner leads 4 or the pad electrodes 10 of the semiconductor chip 1 are arranged in a single row along each side of the chip 1. According to the invention, as shown in FIG. 12(a) and FIG. 12(b), the adjacent pad electrodes 10 of the semiconductor chip 1 may be alternately arranged (staggered) along each side of the semiconductor chip 1, with wires bonded at different elevations to the electrodes. The layout makes the bonding of wires to the pad electrodes 10 easier than before.

Figures 13A, 13B:
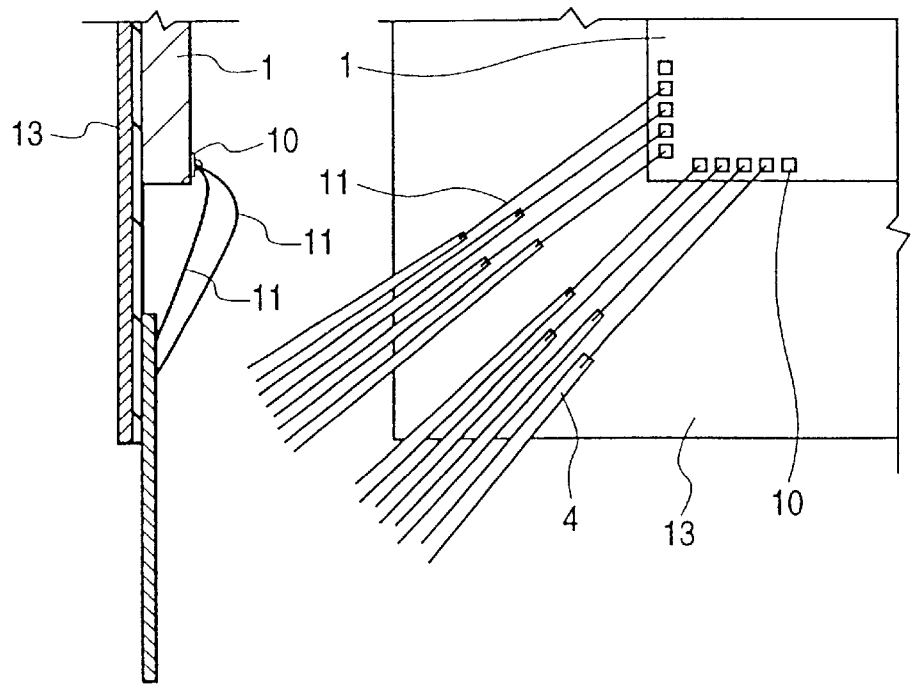
FIG. 13(a) is a plan view.
FIG. 13(b) is a cross-sectional view illustrating how inner lead tips or pad electrodes of a semiconductor chip are laid out.
Figures 14A, 14B:
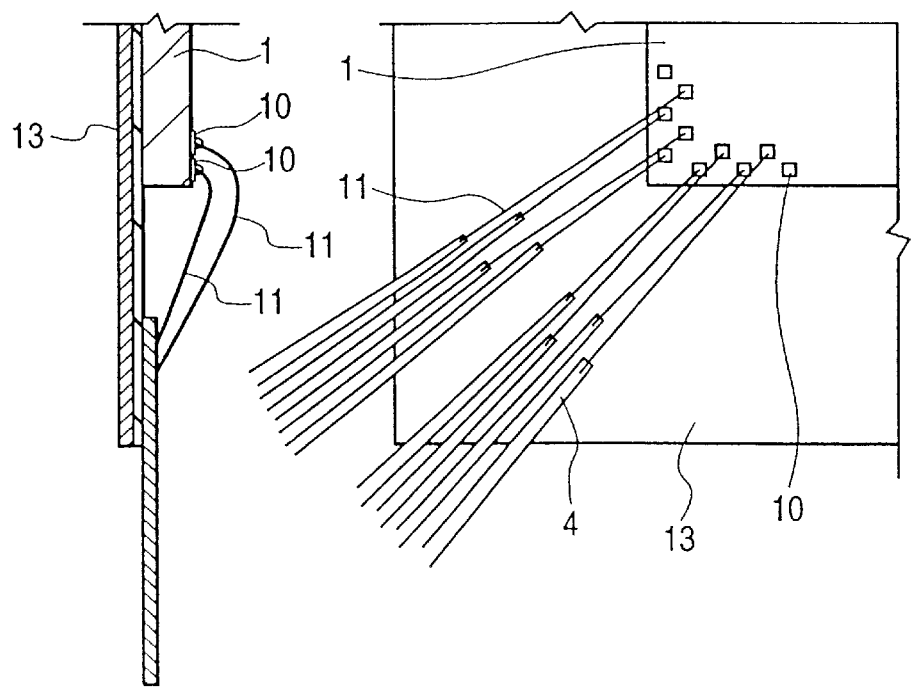
FIG. 14(b) is a plan view.

Likewise, as illustrated in FIG. 13(a) and FIG. 13(b), the tips of the adjacent inner leads 4 may be laid out staggered, with wires bonded at different elevations to the lead tips. Furthermore, as depicted in FIG. 14(a) and FIG. 14(b), the tips of the adjacent inner leads 4 as well as the adjacent pad electrodes 10 of the semiconductor chip 1 may be staggered, with wires bonded at different elevations to the lead tips and the electrodes. The layout makes it easier than before to bond wires to the inner leads 4 and pad electrodes 10.

The slits 15 to be furnished in the heat radiation plate 13 may take diverse patterns as shown in FIGS. 15A through 19.

Figure 15A:
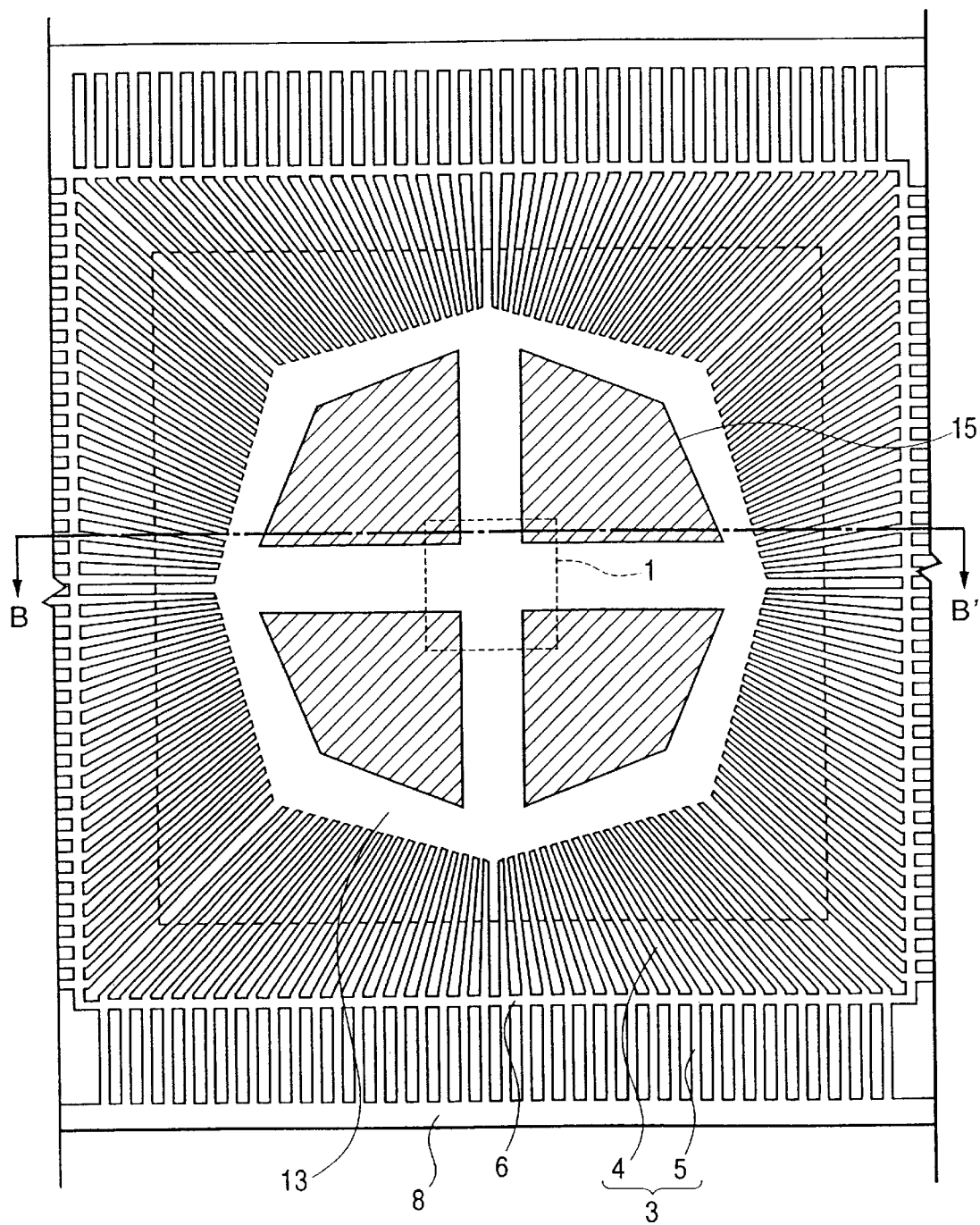
FIG. 15A is a plan view of a lead frame with differently shaped slits in the heat radiation plate.
Figure 15B:
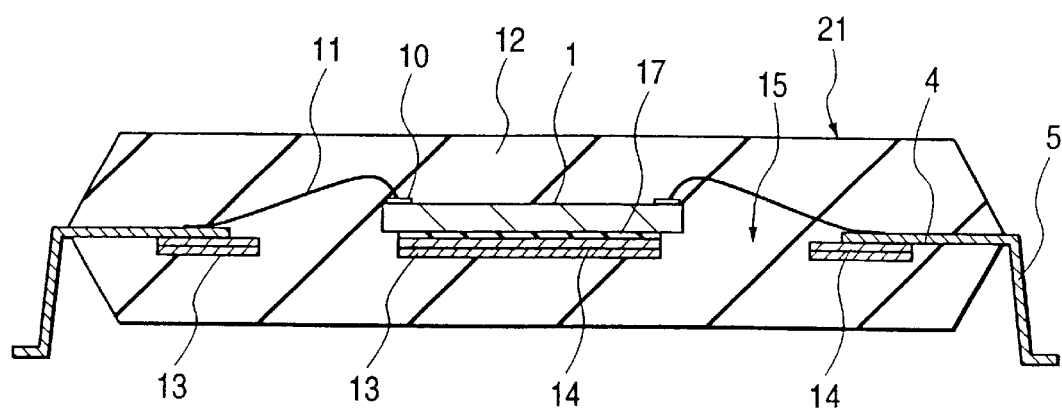
FIG. 15B is a cross-sectional view of a resin-sealed semiconductor device fabricated by use of the lead frame in FIG. 15A, the view being taken on line B–B' in FIG. 15A.
Figure 16:
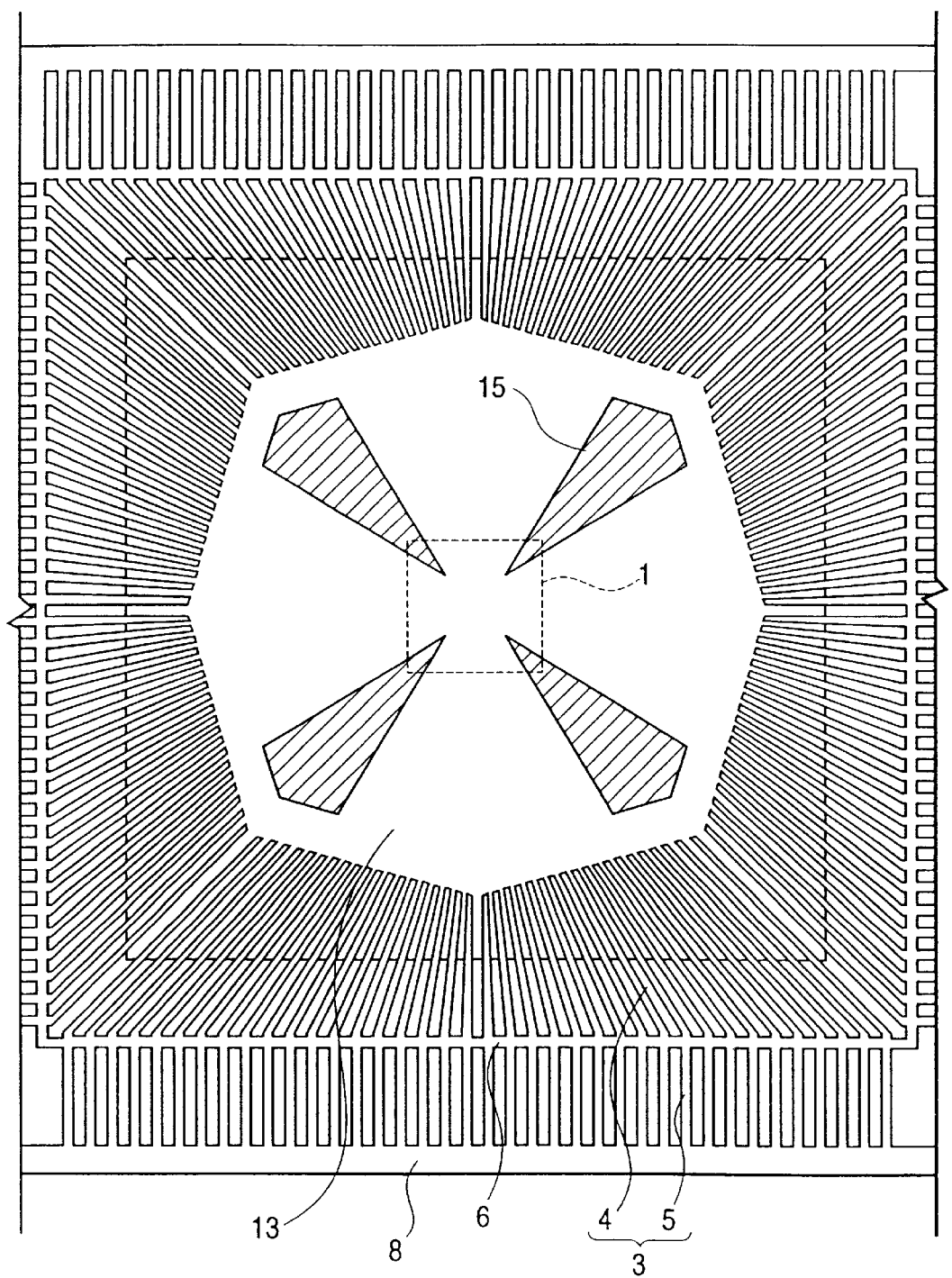
FIG. 16 is a plan view of another lead frame with differently shaped slits in the heat radiation plate.
Figure 17:
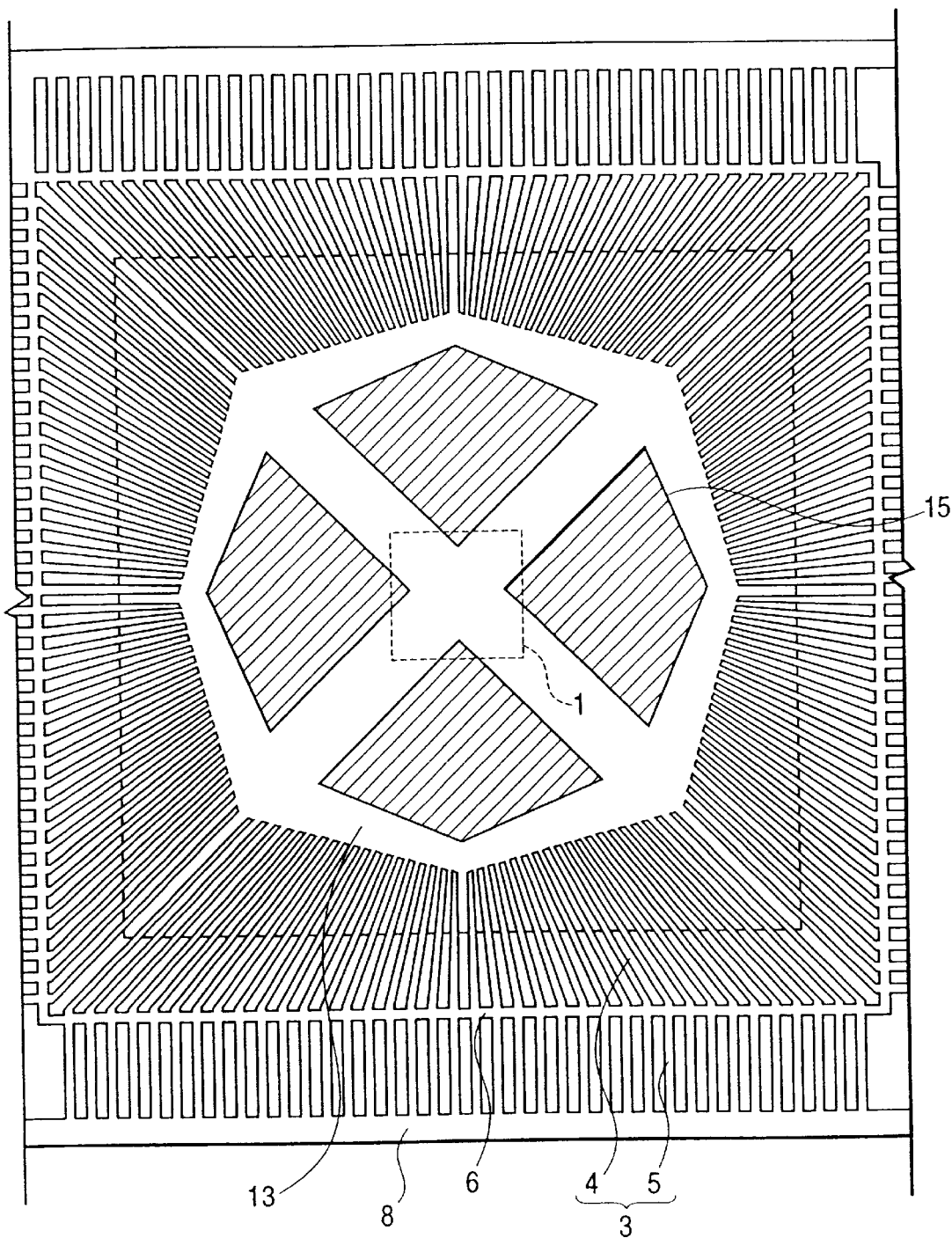
FIG. 17 is a plan view of another lead frame with differently shaped slits in the heat radiation plate.
Figure 18:
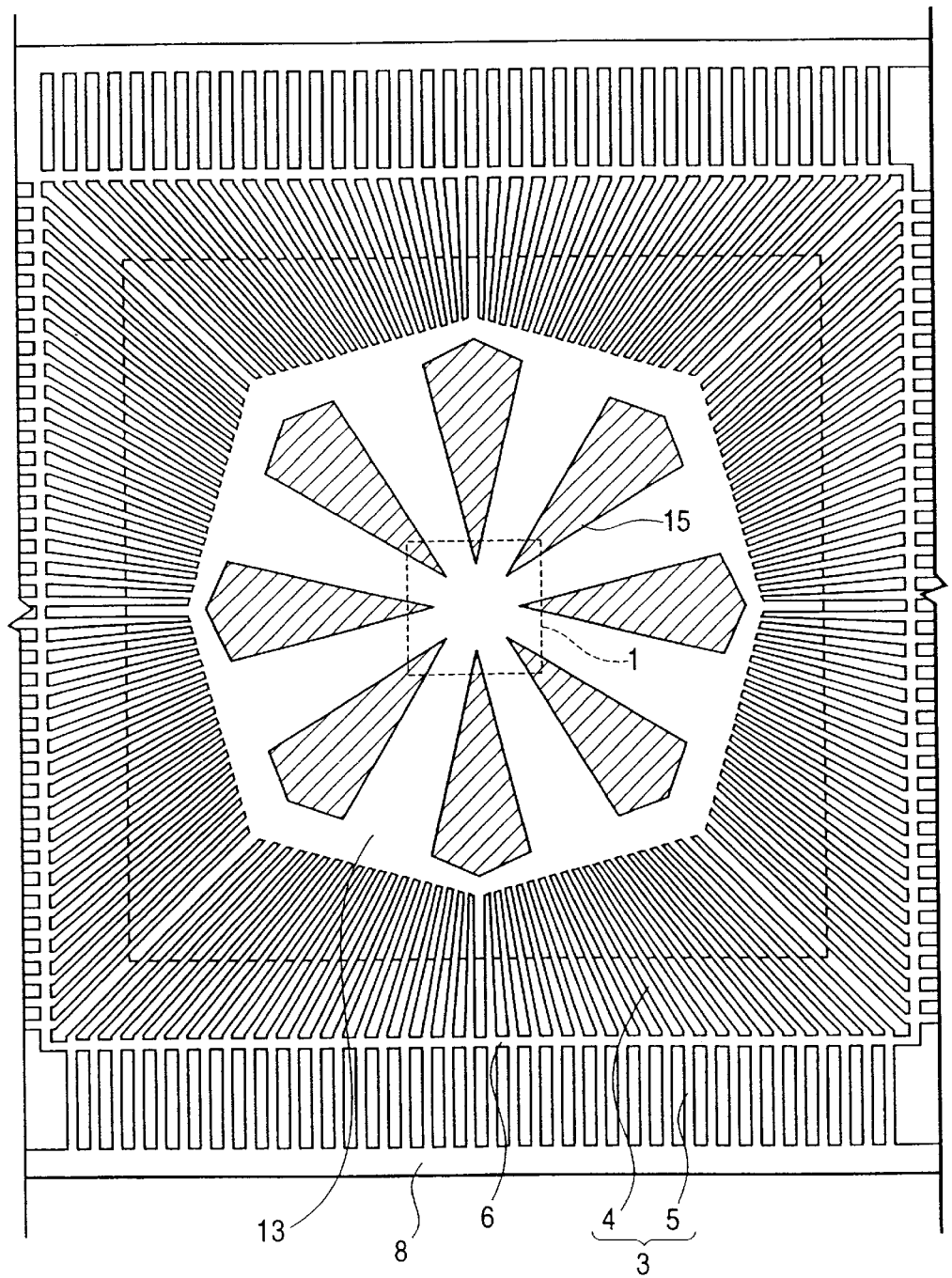
FIG. 18 is a plan view of another lead frame with differently shaped slits in the heat radiation plate.

The patterns show by way of example in FIGS. 15A and 17 give priority to the resistance to the reflow problem by enlarging the area for the slits 15, while the example shown in FIG. 16 favors an enhanced capability of heat dissipation because the slits 15 are made narrower than those in FIG. 15A and FIG. 17 so as to enlarge the paths for heat dissipation correspondingly. The patterns shown by way of example in FIG. 18 seeks a trade-off between resistance to the reflow problem and better heat dissipation. The slits 15 in FIG. 16 are shaped in such a manner that sufficient heat dissipation is guaranteed while the resistance to the reflow problem is improved. The slit pattern in FIG. 15A and that in FIG. 17 are similar in shape and different in orientation. In the pattern of FIG. 15A, the molding member 12 provides higher resistance to the reflow problem by securing the corners of the semiconductor chip 1, i.e., by anchoring the chip corners with resin. In the pattern of FIG. 17, a widened area of contact between the semiconductor chip 1 and the heat radiation plate 13 ensures a better heat dissipation characteristic. A suitable slit pattern may thus be selected depending on what is particularly required of the semiconductor device. FIG. 15B is a cross-sectional view of a semiconductor device fabricated by use of the lead frame in FIG. 15A, the view being taken on line B–B' in FIG. 15A. In FIG. 15B, the parts already shown in FIG. 7 are given the same reference numerals, and details there of are omitted. Some portions of the back of the semiconductor chip 1 are not overlaid with the heat radiation plate 13; these portions are sealed directly by the sealing resin 12.

Figure 19:
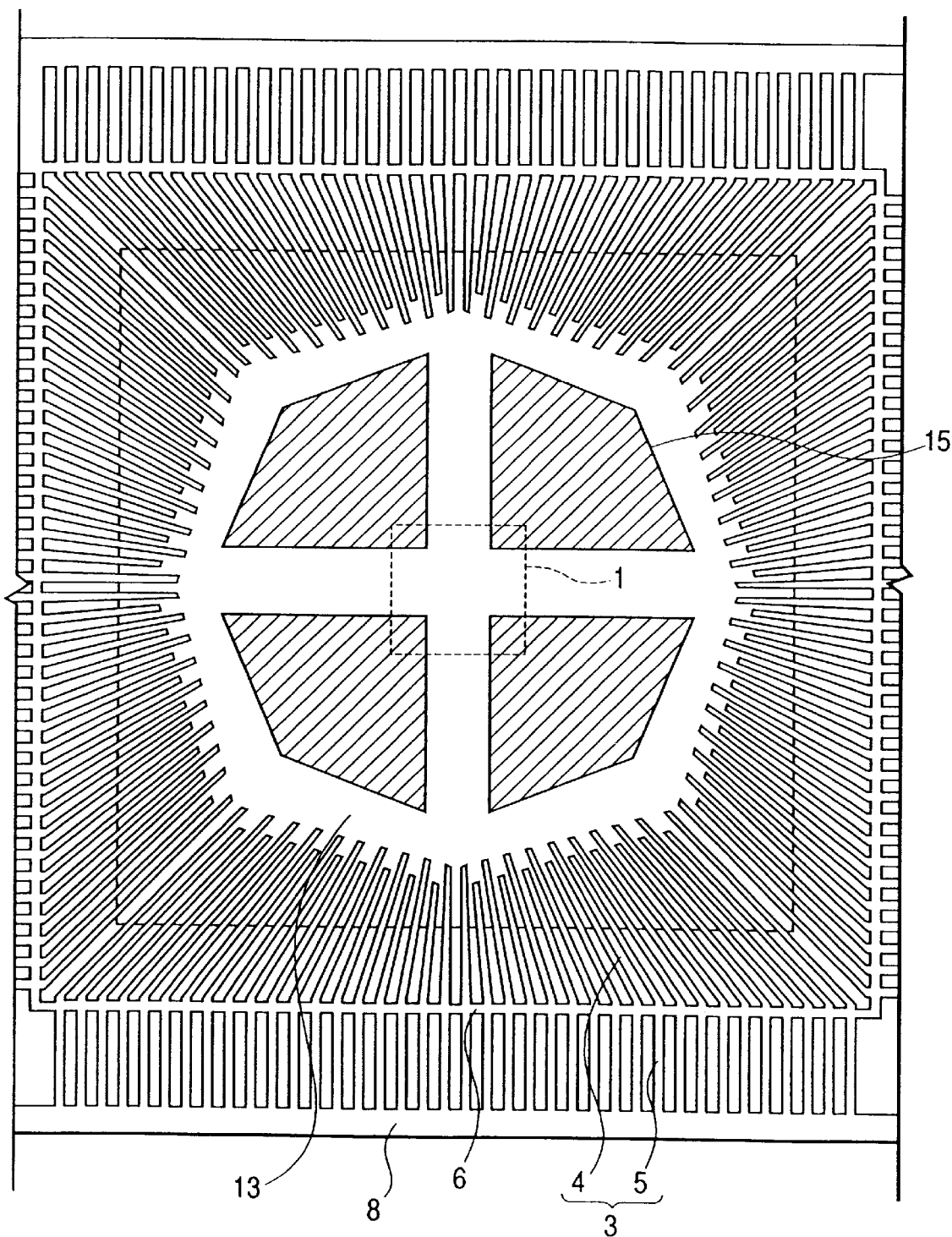
FIG. 19 is a plan view of another lead frame with differently shaped slits in the heat radiation plate.

The slits 15 in the pattern of FIG. 19 are identical in shape to those in FIG. 15A. The difference is that the tips of the inner leads 4 in FIG. 19 are laid out in an alternating arrangement to make the bonding of wires easier. That layout of the inner leads 4 may also apply to the other examples having the different slit shapes in FIGS. 16 through 18. The same also applies to the pad electrodes 10 of the semiconductor chip 1. Illustratively, a semiconductor chip 1 with its pad electrodes 10 staggered as shown in FIG. 12 may be applied to the lead frames in FIGS. 15A through 19.

Figure 20:
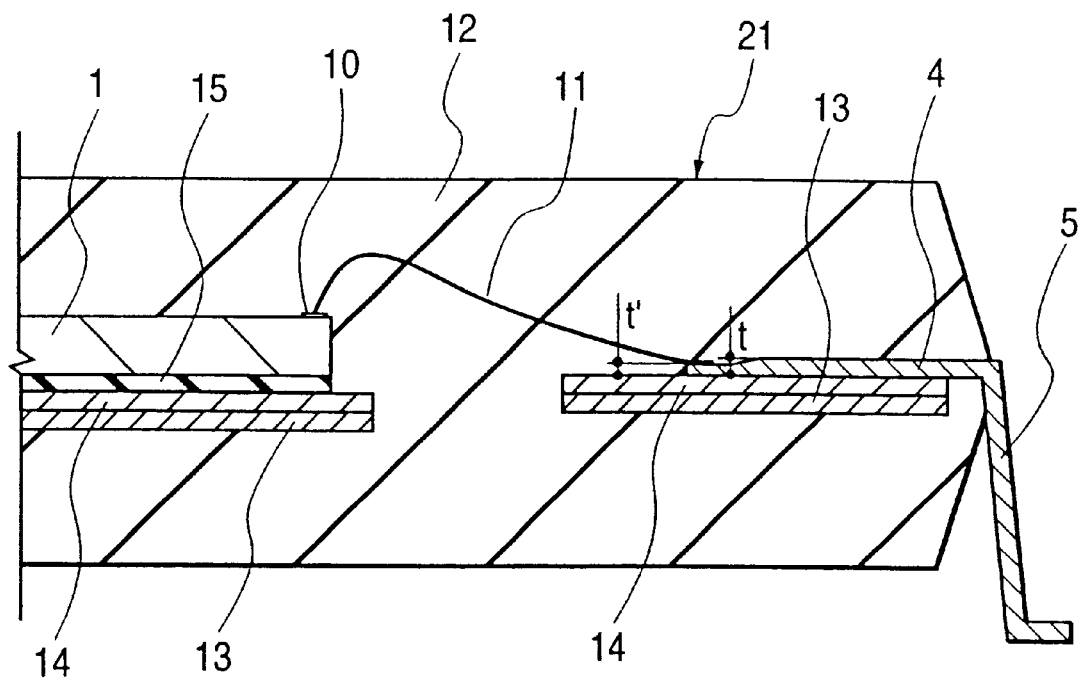
FIG. 20 is a cross-sectional view of a variation of the embodiment.

FIG. 20 shows a variation of this embodiment wherein the tip thickness t' of the inner leads is made greater than the thickness t of the other portions of the leads 3. Such partially different lead thicknesses may be acquired illustratively by localized etching. When the leads are to be fabricated, their thickness constitutes an important factor in achieving the desired precision. That is, the accuracy of lead fabrication is ensured by making the tips of the inner leads 4 thinner than before (i.e., where precision counts); and the remaining lead portions are made sufficiently thick to guarantee sturdiness. When the tips of the inner leads 4 are thinned for accuracy, it is important to fasten the leads to the heat radiation plate 13 to prevent their deformation.

Although the description above contains many specificities, these should not be construed as limiting the scope of the invention but as merely providing illustrations of the presently preferred embodiment of this invention. It is to be understood that changes and variations may be made without departing from the spirit or scope of the claims that follow.

For example, although the embodiment above was shown as having rectangular heat radiation plates on which to secure the leads, this is not a limitation of the invention. Alternatively, the heat radiation plates may be circular. Such round heat radiation plates have the advantage of smoother resin flow during resin molding, which reduces the incidence of voids inside.

The heat radiation plate of the embodiment described above may be equipped with a bonding area for bonding to ground. This arrangement makes up a lead frame ready for bonding to ground, which further enlarges the scope of applications for the inventive semiconductor device.

There need not be a single semiconductor chip to be mounted on the heat radiation plate. Alternatively, a plurality of semiconductor chips may be mounted on the heat radiation plate. That is, the invention also applies advantageously to multi-chip semiconductor devices.

Although the description above has dealt primarily with the field of semiconductor devices constituting the technical background of this invention, that field is not a limitation of the invention. The present invention also applies extensively to devices wherein electronic components are installed using lead frames.

The major effects of this invention as disclosed herein are summarized below.
(1) According to the invention, the tips of the inner leads are secured to the heat radiation plates.
(2) The feature (1) above offers the benefit of stabilizing the bonded wires.
(3) The feature (1) above also prevents deformation of the inner leads.
(4) According to the invention, the tips of the inner leads are laid out at equal intervals on all sides of the semiconductor chip mounting area. The layout offers the benefit of locating the inner lead tips closer to the semiconductor chip mounting area than before.
(5) The feature (4) above shortens the wires to be bonded.
(6) According to the invention, the heat radiation plate has slits formed therein in a radial fashion establish heat propagation paths. The structure enhances protection against the reflow problem.
(7) According to the invention, the slits formed in the heat radiation plate in a radial fashion to establish heat propagation paths will minimize a decline in the heat radiation characteristic.
(8) Also, according to the invention, the inner lead tips are made thinner than before so as to improve the accuracy in fabricating the tips.
(9) Further, according to the invention, the inner lead tips are made thinner than before and are secured to the heat radiation plate. This structure prevents deformation of the inner lead tips.

What is claimed is:

1. A semiconductor device comprising:
    a heat radiation plate including a main surface and a back surface opposite to said main surface, said heat radiation plate having slits penetrating from said main surface to said back surface;
    a semiconductor chip having a semiconductor element and a plurality of electrodes formed on a principal plane, said semiconductor chip being bonded to said main surface of said heat radiation plate;
    a plurality of leads each having an inner lead and an outer lead, tips of the inner leads being fixed on said main surface of said heat radiation plate around the periphery of the bonded semiconductor chip;
    a plurality of bonding wires electrically connecting said inner leads to corresponding electrodes; and
    a molding member sealing said heat radiation plate, said semiconductor chip, and said inner leads;
        wherein said slits are disposed at a portion between a peripheral edge of said semiconductor chip and said tips of the inner leads in a plan view.

2. A semiconductor device according to claim 1, wherein a tip lead width w of said inner lead portions is less than a lead thickness t of said inner lead portions.

3. A semiconductor device according to claim 1, wherein a tip lead pitch p of said inner lead portions is equal to or less than 1.2 times said lead thickness t of said inner lead portions.

4. A semiconductor device according to claim 1, wherein a tip lead thickness t' of said inner lead portions fixed to said heat radiation plate is less than said lead thickness t of said inner lead portions.

5. A semiconductor device according to claim 1, wherein said slits are fabricated in such a manner that heat propagation paths are formed radially in said heat radiation plate.

6. A semiconductor device according to claim 1, wherein pads of said electrodes are laid out in an alternating arrangement on said semiconductor chip.

7. A semiconductor device according to claim 1, wherein said tips of said inner lead portions are laid out in an alternating arrangement.

8. A semiconductor device according to claim 1, wherein said heat radiation plate is rectangular in shape and said slits are fabricated to extend toward four corners of said heat radiation plate.

9. A semiconductor device comprising:
    a heat radiation plate including a main surface and a back surface, opposite to said main surface, said heat radiation plate having slits penetrating from said main surface to said back surface;
    a semiconductor chip having a semiconductor element and a plurality of electrodes formed on a principal plane, said semiconductor chip being bonded to said main surface of said heat radiation plate;
    a plurality of leads each having an inner lead and an outer lead, tips of the inner leads being fixed on said main surface of said heat radiation plate around the periphery of the bonded semiconductor chip, said inner leads being connected electrically to electrodes of said semiconductor chip; and
    a molding member sealing said heat radiation plate, said semiconductor chip, and said inner leads;
        wherein said slits are disposed at a portion between a peripheral edge of said semiconductor chip and said tips of the inner leads in a plan view; and
        wherein said molding member penetrates said heat radiation plate from said main surface to said back surface through said slits.

10. A semiconductor device according to claim 9, wherein said slits are fabricated so that said back of said semiconductor chip is partially exposed.

11. A semiconductor device according to claim 9, wherein said slits are fabricated in such a manner that heat propagation paths are formed radially in said heat radiation plate.

12. A semiconductor device according to claim 9, wherein said heat radiation plate is rectangular in shape and said slits are fabricated to extend toward four corners of said heat radiation plate.

13. A semiconductor device according to claim 9, wherein pads of said electrodes are laid out in an alternating arrangement on said semiconductor chip.

14. A semiconductor device according to claim 9, wherein said tips of said inner lead portions are laid out in an alternating arrangement.

15. A semiconductor device according to claim 9, wherein length of said each slits in radial direction is larger than a length of said each slits in circumferential direction.

16. A semiconductor device comprising:
    a heat radiation plate including a main surface and a back surface opposite to said main surface, said heat radiation plate having a first portion of said main surface, a second portion of said main surface that is at the outer periphery of said first portion and slits penetrating from said main surface to said back surface between said first portion and said second portion;
    a semiconductor chip having a semiconductor element and a plurality of electrodes formed on a principal plane of said semiconductor chip, said semiconductor chip being bonded on said first portion of said heat radiation plate;
    a plurality of leads each having an inner lead and an outer lead, tips of the inner leads being fixed on said second portion of said heat radiation plate;
    a plurality of wires bonded to said inner leads and said electrodes of said semiconductor chip, and electrically connecting said inner leads to corresponding ones of said electrodes; and
    a molding member sealing said heat radiation plate, said semiconductor chip, said inner leads, and said wires,
        wherein said outer leads penetrate from said molding member, and
        wherein said heat radiation plate has a third portion that connects between said first portion and said second portion of said heat radiation plate.

17. A semiconductor device according to claim 16, wherein a thermal resistivity of said third portion of said heat radiation plate is smaller than a thermal resistivity of the insides of said slits.

18. A semiconductor device according to claim 16, wherein a thermal resistivity between said first portion and said second portion through said third portion is smaller than a thermal resistivity between said first portion and said second portion through the insides of said slits.

19. A semiconductor device according to claim 16, wherein said third portion of said heat radiation plate connects between said first portion and said second portion of said heat radiation plate in a direct line.

20. A semiconductor device according to claim 16, wherein a distance between said tips of the inner leads and said second portion are smaller than a thickness of said semiconductor chip.

21. A semiconductor device according to claim 16, wherein a distance between said tips of the inner leads and said second portion are smaller than a distance between said tips of the inner leads and said semiconductor chip.

22. A semiconductor device according to claim 16, wherein said heat radiation plate is comprised of metal plate, and said metal plate is electrically isolated from said tips of the inner leads.

23. A semiconductor device comprising:

a metal plate including a main surface and a back surface opposite to said main surface, said metal plate having a first portion of said main surface, a second portion of said main surface that is at the outer periphery of said first portion and slits penetrating from said main surface to said back surface between said first portion and said second portion;

a semiconductor chip having a semiconductor element and a plurality of electrodes formed on a principal plate of said semiconductor chip, said semiconductor chip being bonded on said first portion of said metal plate;

a plurality of leads each having an inner lead and an outer lead, tips of the inner leads being fixed on said second portion of said metal plate;

a plurality of wires bonded to said inner leads and said electrodes of said semiconductor chip, and electrically connecting said inner leads to corresponding ones of said electrodes; and a molding member sealing said metal plate, said semiconductor chip, said inner leads, and said wires, wherein said outer leads penetrate from said molding member; and wherein said metal plate has a third portion that continuously connects between a peripheral edge of said semiconductor chip and said tips of the inner leads in a plan view.

* * * * *